(12) United States Patent
Kejariwal et al.

(10) Patent No.: US 7,262,654 B2
(45) Date of Patent: Aug. 28, 2007

(54) CIRCUITS AND METHODS FOR MINIMIZING CHOPPING ARTIFACTS AT THE OUTPUT OF A CHOPPER-STABILIZED OPERATIONAL AMPLIFIER

(75) Inventors: Murari Kejariwal, Austin, TX (US); Gowtham Vemulapalli, Austin, TX (US); John Laurance Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 196 days.

(21) Appl. No.: 11/036,082

(22) Filed: Jan. 14, 2005

(65) Prior Publication Data
US 2006/0158244 A1   Jul. 20, 2006

(51) Int. Cl.
*H03F 1/02* (2006.01)
(52) U.S. Cl. ............................................ 330/9; 330/51
(58) Field of Classification Search .................... 330/9, 330/51; 327/124, 307
See application file for complete search history.

(56) References Cited

U.S. PATENT DOCUMENTS

| | | | |
|---|---|---|---|
| 5,115,202 A | 5/1992 | Brown | |
| 5,926,066 A | 7/1999 | Sauer | |
| 6,064,257 A | 5/2000 | Sauer | |
| 6,130,578 A | 10/2000 | Tang | |
| 6,188,294 B1 | 2/2001 | Ryan et al. | |
| 6,201,835 B1 | 3/2001 | Wang | |
| 6,262,626 B1 * | 7/2001 | Bakker et al. | 330/9 |
| 6,307,430 B1 | 10/2001 | Thomsen | |
| 6,414,558 B1 * | 7/2002 | Ryan et al. | 331/78 |
| 6,788,136 B2 * | 9/2004 | McGrath | 330/9 |

OTHER PUBLICATIONS

Thomsen A. et a.l.: "A Fivo Stago Choppor Stabilizod Instrumentation Amplifier Using Feedforward Compensation" VLSI Circuits, 1998. Digest of Technical Papers. 1998. Symposium on Honolulu, HI, USA Jun. 11-13, 1998, New York, NY, IEEE, US, Jun. 11, 1998 pp. 220-223, XP 010291208.

K.C. Hsieh et al.: "A Low-Noise Chopper-Stabilized Differential Switched-Capacitor Filtering Technique", IEEE Journal of Solid Sgtate Circuits, vol. SC-16, No. 6, Jan. 12, 1981 pp. 708-715, XP002379911.

Wang, C.B.: "A 20-bit 25-kHz delta-sigma A/D converter utilizing a frequency-shaped chopper stabilization scheme", IEEE Journal of Solid-State Circuits, vol. 36, No. 3, Mar. 3, 2001, pp. 566-569.

* cited by examiner

*Primary Examiner*—Khanh Van Nguyen
(74) *Attorney, Agent, or Firm*—Thompson & Knight LLP; James J. Murphy (57) ABSTRACT

An operational amplifier including at least one amplifier stage and chopping circuitry for chopping an input signal to the amplifier stage and an output signal from the chopping signal having a frequency randomly varying within the selected frequency band.

18 Claims, 10 Drawing Sheets

CIRCUITS AND METHODS FOR MINIMIZING CHOPPING ARTIFACTS AT THE OUTPUT OF A CHOPPER-STABILIZED OPERATIONAL AMPLIFIER

FIELD OF INVENTION

The present invention relates in general to linear circuits, and in particular to circuits and methods for minimizing chopping artifacts at the output of a chopper stabilized operational amplifier.

BACKGROUND OF INVENTION

Operational amplifiers ("opamps") are basic blocks utilized in a wide range of electronic circuits. In addition to amplification and buffering, opamps are typically used to implement functions such as summing, integration, multiplication, and differentiation. Typical opamp applications include comparators, oscillators, filters, sample and hold circuits, and instrumentation amplifiers.

Multiple-stage operational amplifiers (opamps) typically include a cascade of one or more gain stages and an output driver stage. The output stage is, for example, a Class AB amplifier that provides load drive capability. To achieve an overall high open loop gain (e.g. greater than 150 dB), a multiple-stage opamp normally requires three or more gain stages.

Opamps are often subject to an inherent input-referred offset voltage. Generally, when the voltages at the differential inputs of the opamp are equal, the output voltage should theoretically be at the mid-supply voltage. In actual applications, a slight offset in the output voltage from the mid-supply voltage occurs when the input voltages are equal. For some opamp applications, input-referred offset is not acceptable, and therefore various techniques have been developed for minimizing input-referred offset.

One technique for minimizing input-referred offset is to match the input differential transistor pair and the load transistor pair of one or more of the internal stages, and typically the first stage. Another technique is to increase the sizes of the input transistor pair. However, even when these techniques are utilized, some finite input referred offset still remains.

A third technique for addressing the problem of input-referred offset is chopper stabilization. In chopper stabilization, the signal of interest at the input of one or more stages of an opamp is modulated or "chopped" at a high frequency. Typically, the chopping frequency is selected to be at least twice the frequency of the band of the signal of interest to avoid aliasing. At the output of the chopper-stabilized stage, the signal of interest is demodulated back into the original signal band by a second chopping operation. This second chopping modulates any inherent offset and/or flicker (1/f) noise out of the frequency band of the signal of interest. While often utilized, chopper stabilization nevertheless generates artifacts in the opamp output, which are often also not acceptable.

For high performance applications, such as instrumentation amplifiers, improved techniques for addressing the problem of input-referred voltage offset in opamps are required. In particular, these techniques should allow for the implementation of chopper-stabilization without the introduction of an excessive number of artifacts in the opamp output. These techniques should not unduly complicate the overall opamp design, significantly increase the power consumption of the overall device, or require a substantial amount of additional chip area to fabricate.

SUMMARY OF INVENTION

The principles of the present invention are embodied in circuits and methods that minimize chopping artifacts in the output signal of a chopper-stabilized operational amplifier. According to one particular embodiment, an operational amplifier is disclosed, which includes at least one amplifier stage and chopping circuitry for chopping an input signal to the amplifier stage and an output signal from the amplifier stage with a chopping signal having a frequency randomly varying within a selected frequency band.

Embodiments of the present inventive principles advantageously randomize the chopping frequency utilized to chop an input signal to an operational amplifier and an output from the operational amplifier, such that the energy of the chopping artifacts is spread across a wider bandwidth, similar to noise. By limiting this bandwidth, this chopping artifact energy is more easily filtered.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1-5 of the drawings, in which like numbers designate like parts.

Figure 1A:
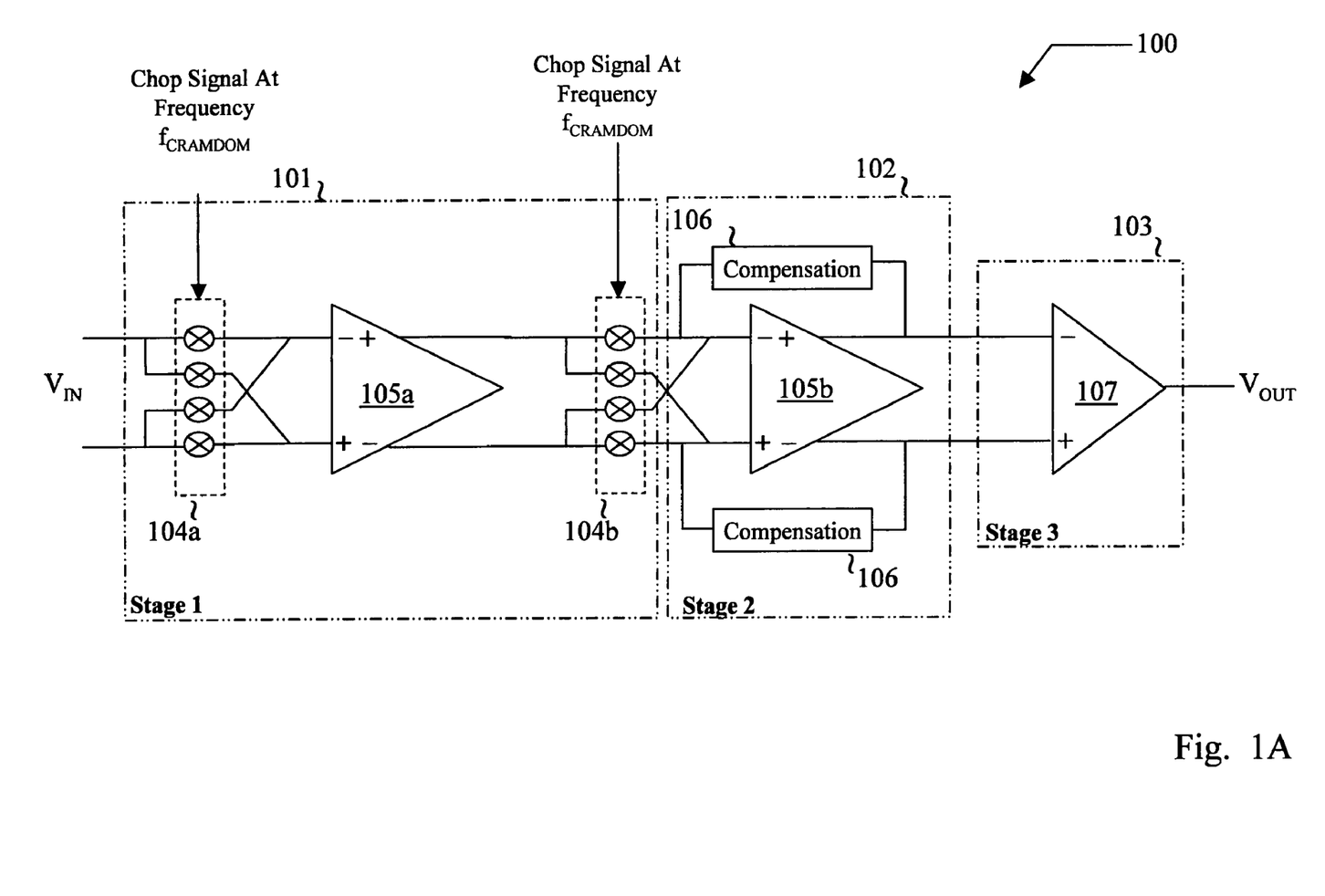
FIG. 1A is a high level block diagram of an exemplary multiple-stage chopper-stabilized operational amplifier (opamp) suitable for demonstrating the principles of the present invention.

FIG. 1 is a high-level block diagram of an exemplary multiple-stage operational amplifier (opamp) 100 embodying the principles of the present invention. Opamp 100 includes two (2) gain stages 101 and 102 and an output driver stage 103, although in alternate embodiments the number of gain stages may vary.

First gain stage 101 includes an opamp 105a and a set of input chopper switches 104a. Chopper switches 104a couple and cross couple the differential input signal $V_{IN}$ between the inverting (−) and non-inverting (+) inputs of amplifier 105a at a randomized chopping frequency $f_{CRANDOM}$. Chopping switches 104a randomly modulate the input signal $V_{IN}$ to a limited frequency band at least twice the frequency of the highest frequency of the input signal frequency band. The original input signal $V_{IN}$ is recovered by demodulating the output of opamp 105a with chopping switches 104b switching at the randomized chopping frequency $f_{CRANDOM}$. At the same time, any input referenced voltage offset and/or flicker (1/f) noise generated by amplifier 105a is modulated out of the signal band.

First gain stage 101 controls the input characteristics of opamp 100. In one embodiment, amplifier 105a of first gain stage 101 includes parallel NMOS and PMOS input transistors such that the input signal $V_{IN}$ can swing from rail to rail (i.e. 0v to $V_{IN}$). In the illustrated embodiment, first gain stage 101 provides a low frequency gain of greater than 80 dB. Similarly, second gain stage 102 includes an amplifier 105b and compensation circuitry 106 implementing dominant pole compensation for the combined amplifier stages 101 and 102. In the illustrated embodiment, second gain stage 102 provides a gain of greater than 70 dB.

Together, first and second gain stages 101 and 102 provide an open loop gain greater than 150 db and a closed loop roll-off frequency response of nominally −20 db/decade, such that the cascade of first and second gain stages 101 and 102 is unconditionally stable.

Output driver stage 103 includes an amplifier 107, with inverting (−) and non-inverting (+) differential inputs, and a single-ended output driving the opamp 100 output signal $V_{OUT}$. In the illustrated embodiment, output driver stage 103 is a class AB amplifier with an independent closed loop. With respects to overall multiple-stage opamp 100, output driver stage 103 operates open loop, and therefore has a low gain, of approximately 6 dB, to ensure multiple-stage opamp 100 is stable. Additionally, output driver stage 103 performs differential to single-ended conversion.

Figure 1B:
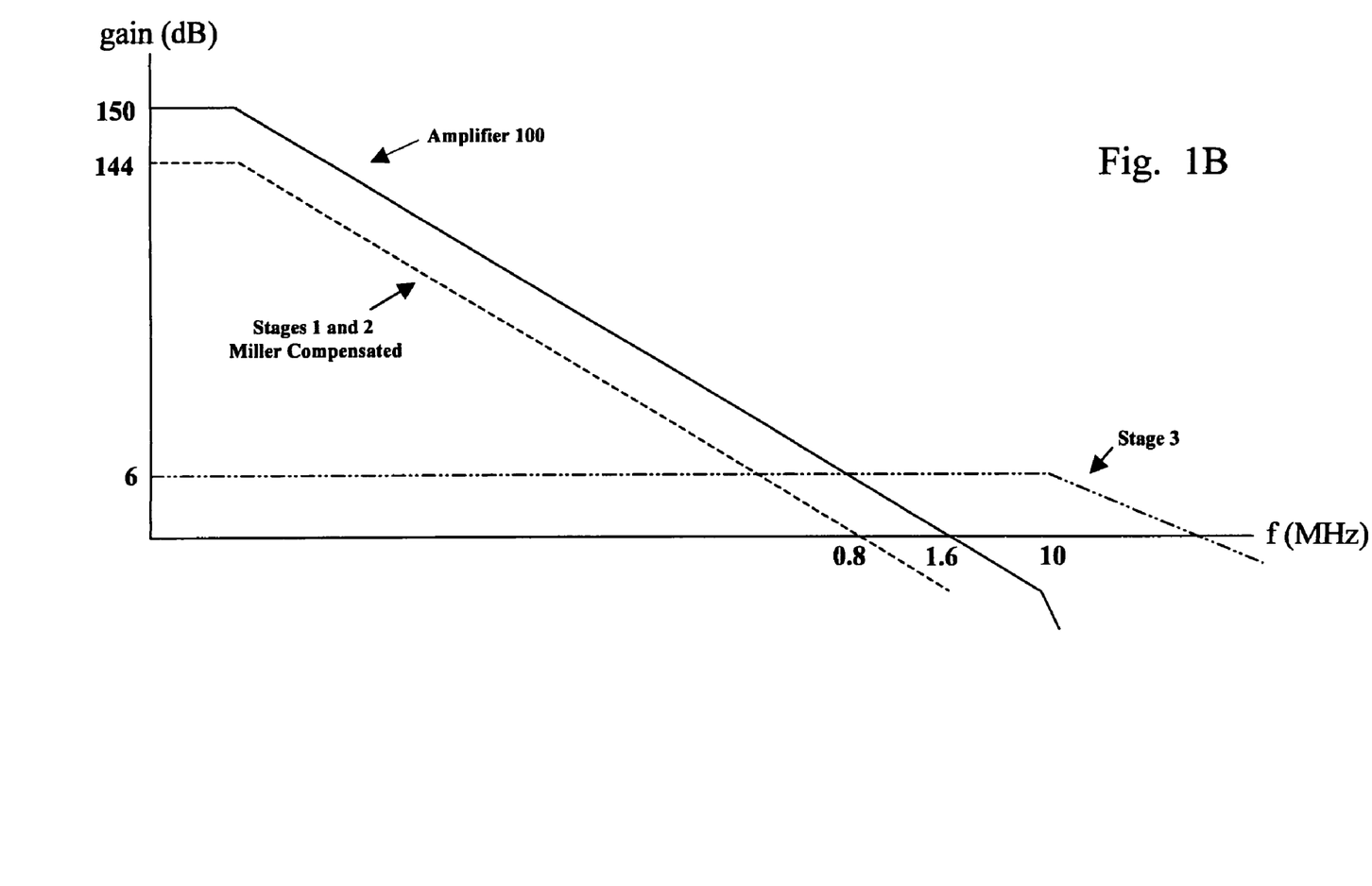
FIG. 1B is a gain versus frequency plot generally describing the operational characteristics of the multiple-stage operational amplifier of FIG. 1A.

To avoid nested Miller compensation within opamp 100, output driver stage 103 implements a dominant pole at a high frequency, as shown in FIG. 1B, which is a gain versus frequency plot generally describing the operational characteristics of multiple-stage operational amplifier 100 of FIG. 1A. As shown by the dashed line in FIG. 1B, first and second gain stages 101 and 102 provide high gain and implement a conventional (un-nested) dominant pole compensation scheme. Output driver stage 103, as represented by the broken line, provides a high output voltage swing and a low output impedance. The dominant pole introduced by output stage 103 is at a frequency of approximately 10 MHz, in the embodiment described in FIG. 1B, which is well above the unity-gain cross-over frequency of opamp 100.

Figure 2:
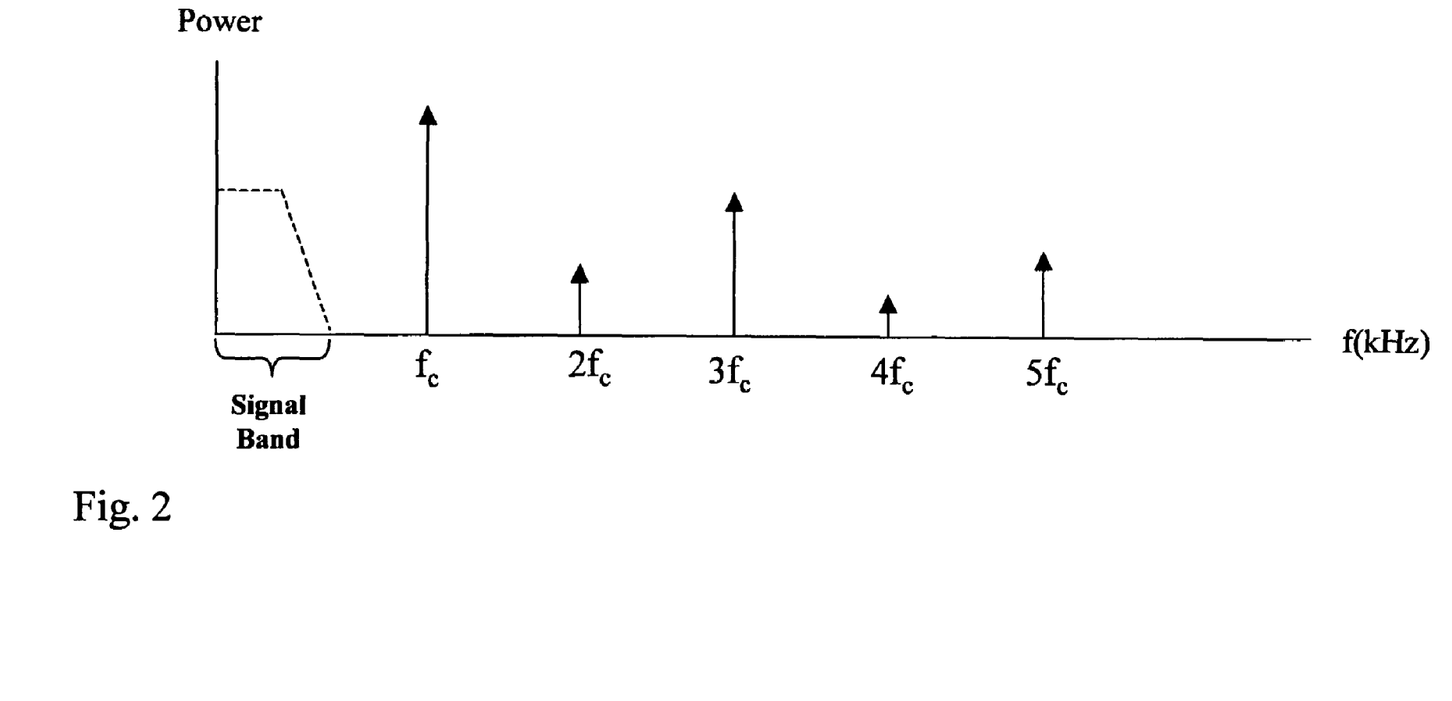
FIG. 2 is a power versus frequency plot illustrating the generation of chopping artifacts at the output of a typical conventional chopper stabilized opamp.

FIG. 2 is a power versus frequency diagram illustrating the chopping artifacts output from a conventional chopper stabilized opamp. In FIG. 2, chopping of the input signal is performed using a chopping signal with a fixed frequency $f_c$. The chopping operation generates, at the outputs of the output chopping switches, a fundamental chopping component at the chopping frequency $f_c$ and smaller artifacts at the harmonics of the chopping frequency $f_c$. These artifacts, especially at the fundamental chopping frequency $f_c$, contain significant high-frequency energy and are spread across a wide-frequency band, and hence are difficult to filter.

According to the principles of the present invention, chopping frequency artifacts, such as those shown in FIG. 2, are minimized by generating a chopping signal CHOP SIGNAL with a randomly varying chopping frequency $f_{CRANDOM}$. Utilizing a randomly varying chopping frequency $f_{CRANDOM}$ produces lower-energy chopping artifacts at random frequencies, rather than the high-energy chopping artifacts at fixed frequencies shown in FIG. 2. Consequently, the chopping artifacts appear as noise. By limiting the randomized chopping frequency to a certain frequency band, the noise floor for that frequency band increases. The limited frequency band is then filtered to remove the additional noise.

Figure 3A:
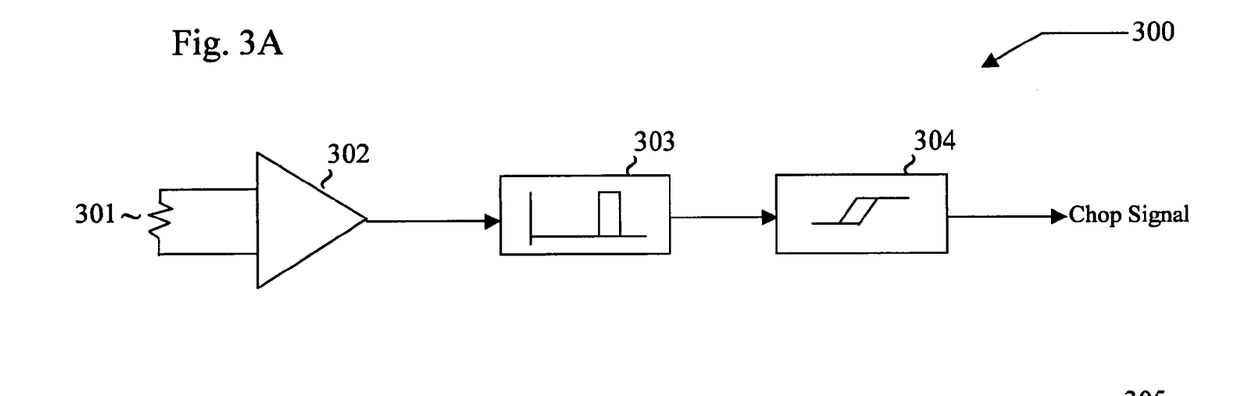
FIG. 3A is block diagram of a representative thermal-noise random chop signal generation circuit suitable for controlling the chopping switches of the chopper-stabilized opamp of FIG. 1A according to the principles of the present invention.

FIG. 3A is one thermal-noise based random frequency chopping signal generator 300 suitable for generating the chopping signal CHOP SIGNAL with a randomly varying chopping frequency $f_{CRANDOM}$. In this embodiment of the inventive principles, the thermal noise of a resistor 301 provides a source of white noise. This white noise is amplified by an amplifier 302 and bandpass filtered by bandpass filter 303 to produce frequency band-limited white noise. A Schmidt trigger or comparator 304 generates a square-wave chopping signal CHOP SIGNAL from the frequency band-limited white noise.

Figure 3B:
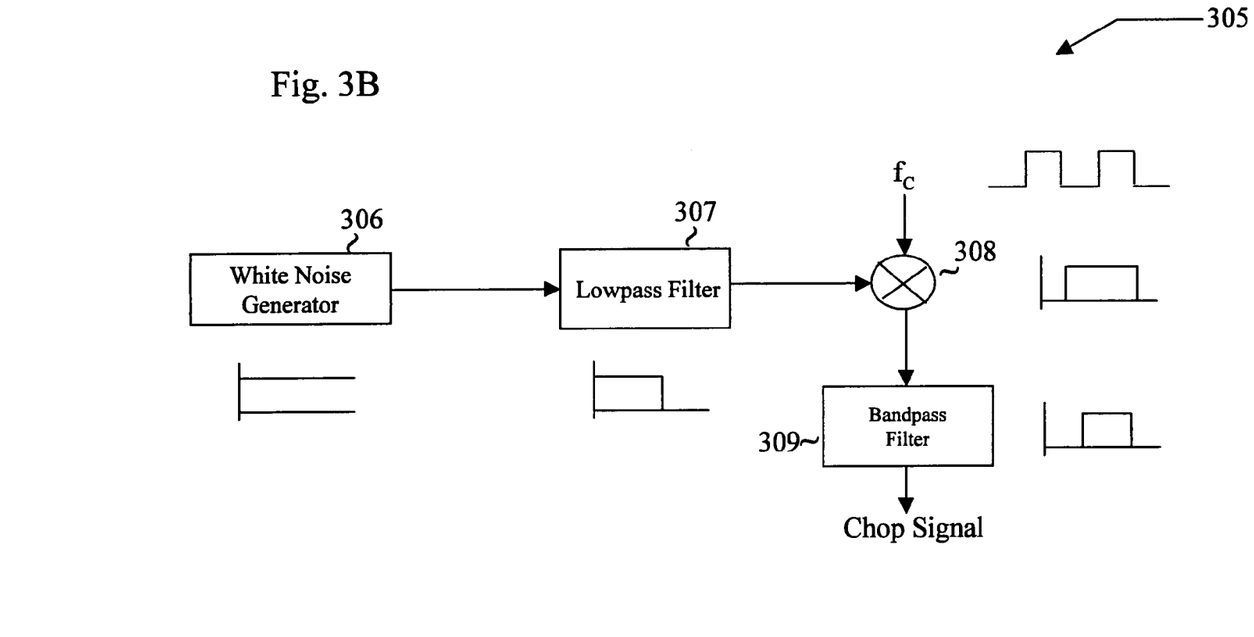
FIG. 3B is a block diagram of another representative thermal-noise based random chop signal generation circuit suitable for controlling the chopping switches of the chopper stabilized opamp of FIG. 1A according to the principles of the present invention.

An alternate thermal-noise based random frequency chopping signal generator 305 is shown in FIG. 3B. In random frequency chopping signal generator 305, a white noise generator 306 generates white noise which is then bandwidth limited by a lowpass filter 307. The bandwidth-limited white noise is then up-modulated by a multiplier 308 with a mean chopping signal at the frequency $f_C$. The modulated signal is finally filtered by bandpass filter 309 to generate the chopping signal CHOP SIGNAL which is bandwidth limited.

Figure 4A:
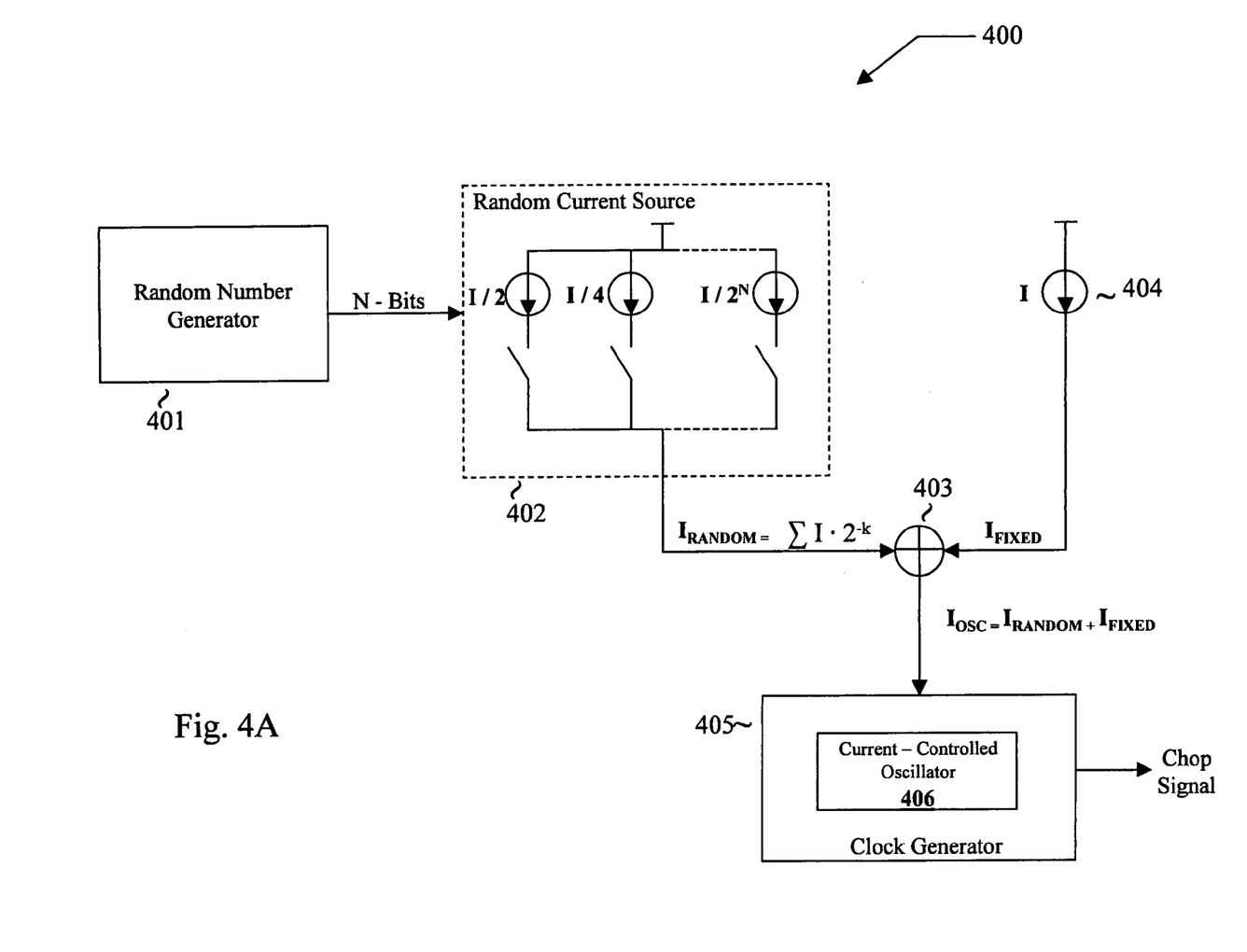
FIG. 4A is a block diagram of a representative random number based random chop signal generation circuit suitable for controlling the chopping switches of the chopper stabilized opamp of FIG. 1A according to the principles of the present invention.
Figure 4B:
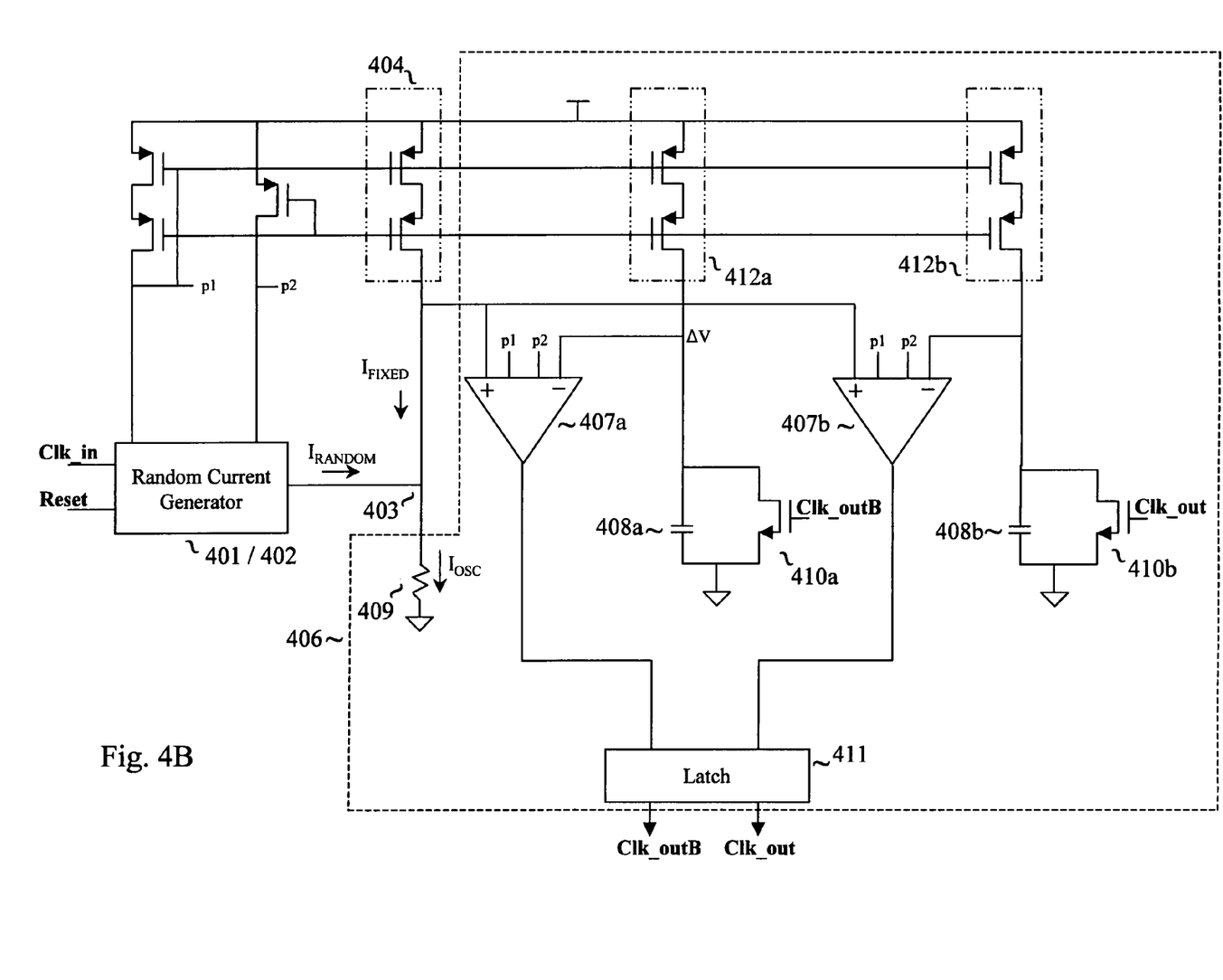
FIG. 4B is an electrical schematic diagram of a representative oscillator suitable for utilization as the oscillator depicted in FIG. 4A.
Figure 4C:
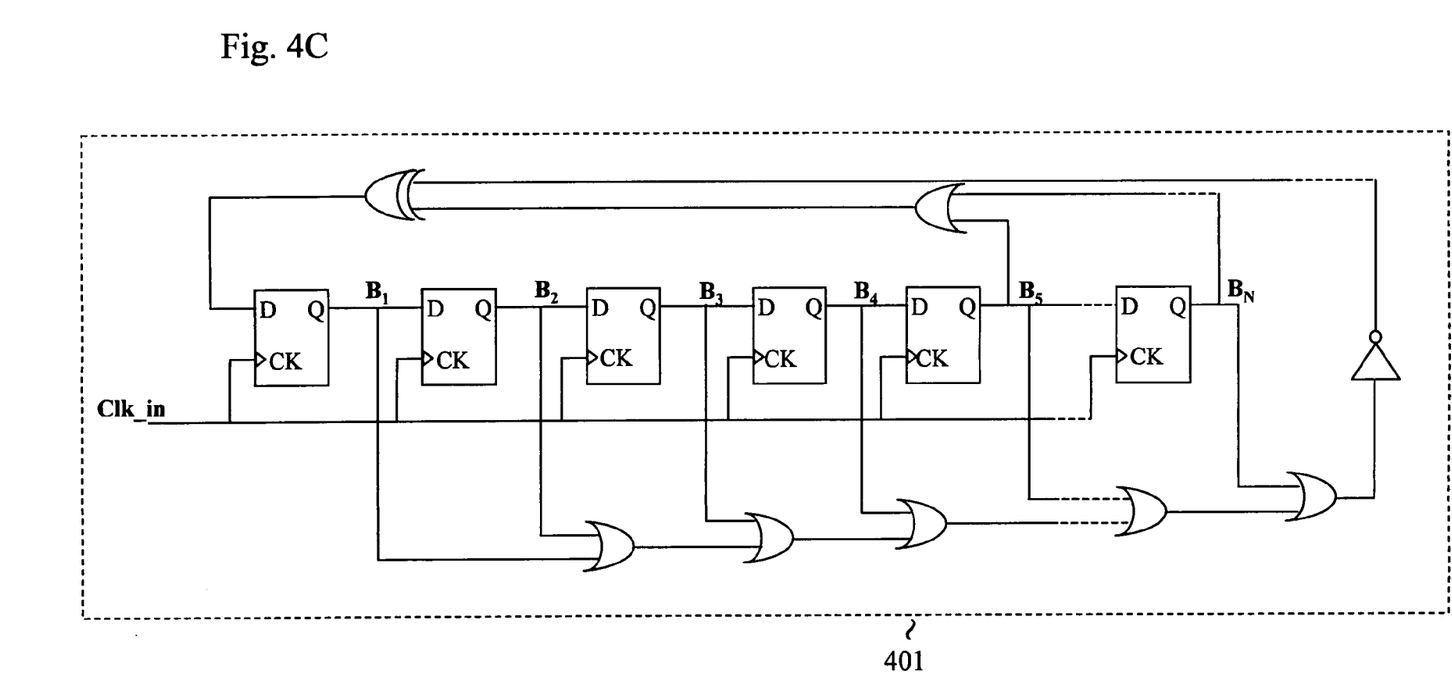
FIG. 4C is an electrical schematic diagram of a representative random number generator suitable for utilization as the random number generator depicted in FIG. 4A.

FIGS. 4A-4D depict a random number based random frequency chopping signal generator 400 according to the principles of the present invention. As shown in FIG. 4A, a random number generator 402 generates a pseudo-random N-bit number. A representative pseudo-random generator suitable for this purpose is shown in FIG. 4C, although any one of a number of pseudo-random number generators can be used in the alternative.

Figure 4D:
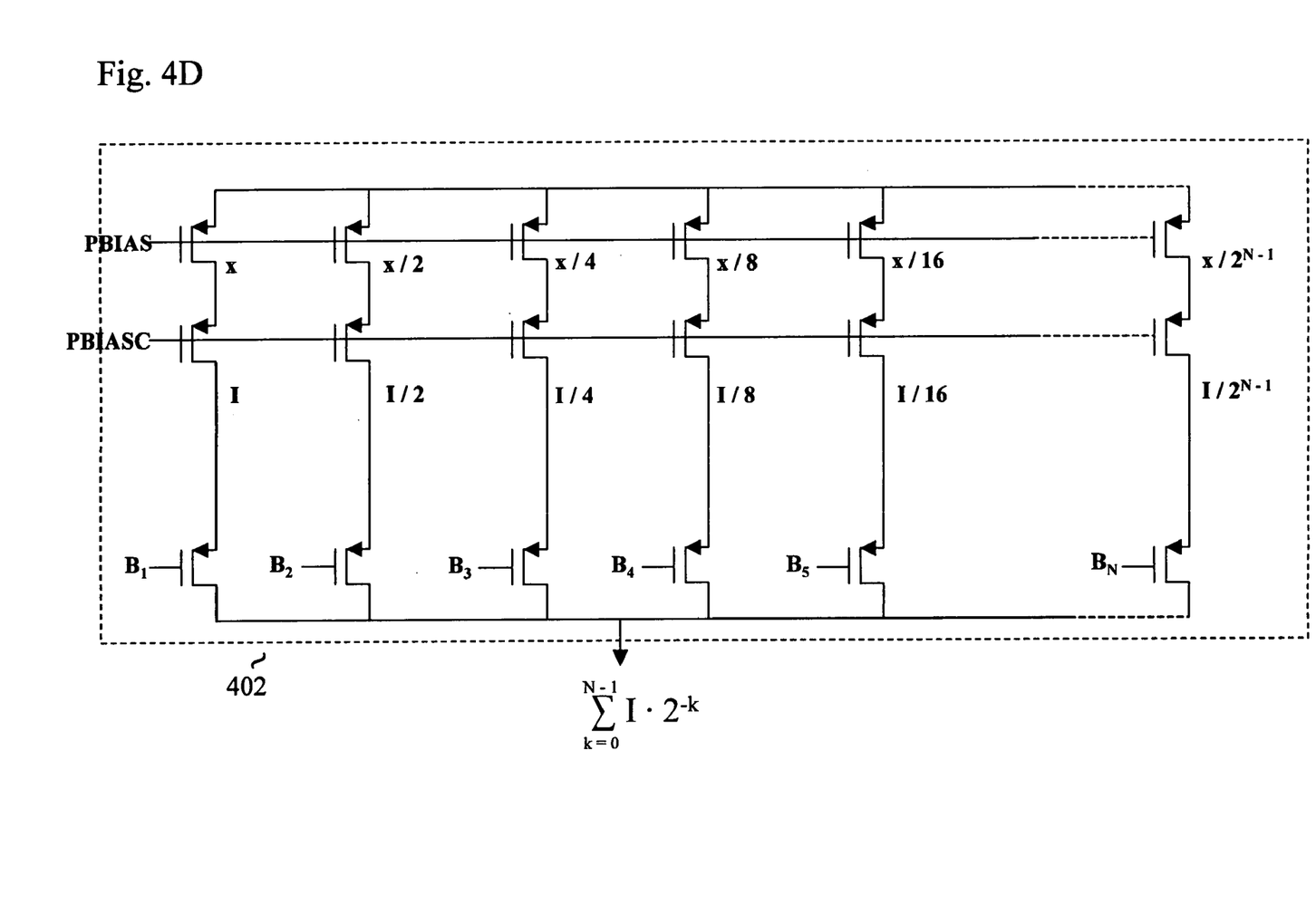
FIG. 4D is an electrical schematic diagram of a representative random current generator suitable for utilization as the random current generator depicted in FIG. 4A.

The N-bits representing the pseudo-random number generated by pseudo-random number generator 401 control a random current source 402, which provides a corresponding current $I_{RANDOM}$. An exemplary embodiment of random current source 402 is shown in FIG. 4D, in which bits $B_0$-$B_N$ represent the N-bit pseudo-random number. In the illustrated embodiment, bits $B_0$-$B_N$ vary the current $I_{RANDOM}$ in quanta of $I/2^N$, in which I represents a given base current.

A summer or summing node 403 sums the current $I_{RANDOM}$ with a fixed current $I_{FIXED}$, provided by a fixed current source 404, to generate a pseudo-randomly varying oscillator control current $I_{OSC}$. In the illustrated embodiment, the current $I_{FIXED}$ is equal to the base current 1. Oscillator control current $I_{OSC}$ is provided to clock generator 405, which includes a current controlled oscillator 406. As the oscillator control current $I_{OSC}$ varies with variations in the random current $I_{RANDOM}$, the chopping frequency $f_{CRANDOM}$ of the chopping signal varies proportionately CHOP SIGNAL.

FIG. 4B depicts random number based random frequency chopping signal generator 400 in further detail. In the embodiment shown in FIG. 4B, current controlled oscillator 406 is a relaxation oscillator, although alternate embodiments may utilize other types of current controlled oscillators. In particular, comparators 407a and 407b respectively compare the voltages across capacitors 408a and 408b with the voltage across a resistor 409. Corresponding switches 410a and 410b switch in response to the complementary clock signals CLK_OUT and CLK_OUTB fed-back from output latch 411. Amplifiers 407a and 407b therefore generate corresponding sawtooth voltages, one-hundred and eighty (180) degrees out of phase.

Oscillator 406 oscillates at a frequency controlled by the sizes of capacitors 408a and 408b and resistor 409, and the currents through capacitors 408a and 408b and resistors 409. In the embodiment of FIG. 4B, fixed currents are provided to capacitors 408a and 408 by current sources 412a and 412b. The current $I_{FIXED}$, discussed above, flows through resistor 409 to set the nominal oscillation frequency, while the pseudo-randomly generated current $I_{RANDOM}$ pseudo-randomly varies the oscillation frequency from nominal. Generally, the frequency of oscillation $f_{OSC}$ of oscillator 406 is characterized by Equation (1):

$$f_{OSC}=(I_C/I_{OSC}) \cdot 1/(2 \cdot R \cdot C)$$

in which, C is the capacitance value of each capacitor 408a and 408b, R is the resistance value of resistor 409, $I_C$ is the current through each capacitor 408a and 408b, and $I_{OSC}$ is the current through resistor 409. Hence a change in the current $I_{OSC}$ in response to a change in the randomly generated current $I_{RANDOM}$ results in a random change in the oscillation frequency $f_{OSC}$.

Clock generator 405 utilizes clock signal CLK_OUT and the randomized frequency $f_{CRANDOM}$ to generate the ultimate chopping signal CHOP SIGNAL controlling chopping switches 104a and 104b of FIG. 1.

As indicated by Equation (1), in addition to changing the current $I_{RANDOM}$ to vary the oscillation frequency of oscillator 408, a change in the oscillation frequency $f_{OSC}$ may also be implemented by varying the current through capacitors 408a and 408b, the value of resistor 409, or both. An alternate embodiment of oscillator 406 describing these principles is shown in FIGS. 5A and 5B.

Figure 5A:
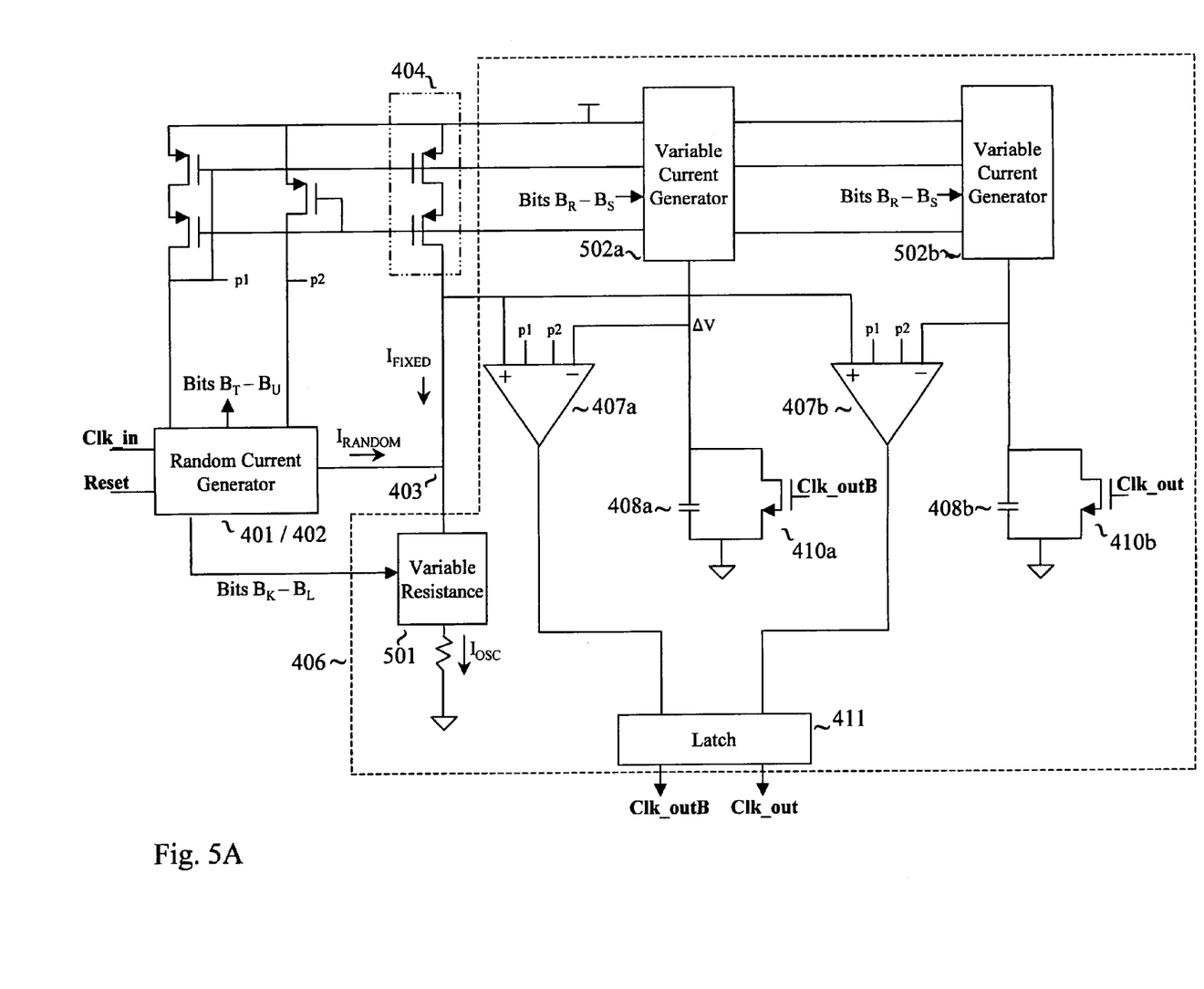
FIG. 5A is an electrical schematic diagram of another random number based random chop signal generation circuit suitable for controlling the chopping switches of the chopper stabilized opamp of FIG. 1A according to the principles of the present invention.
Figure 5B:
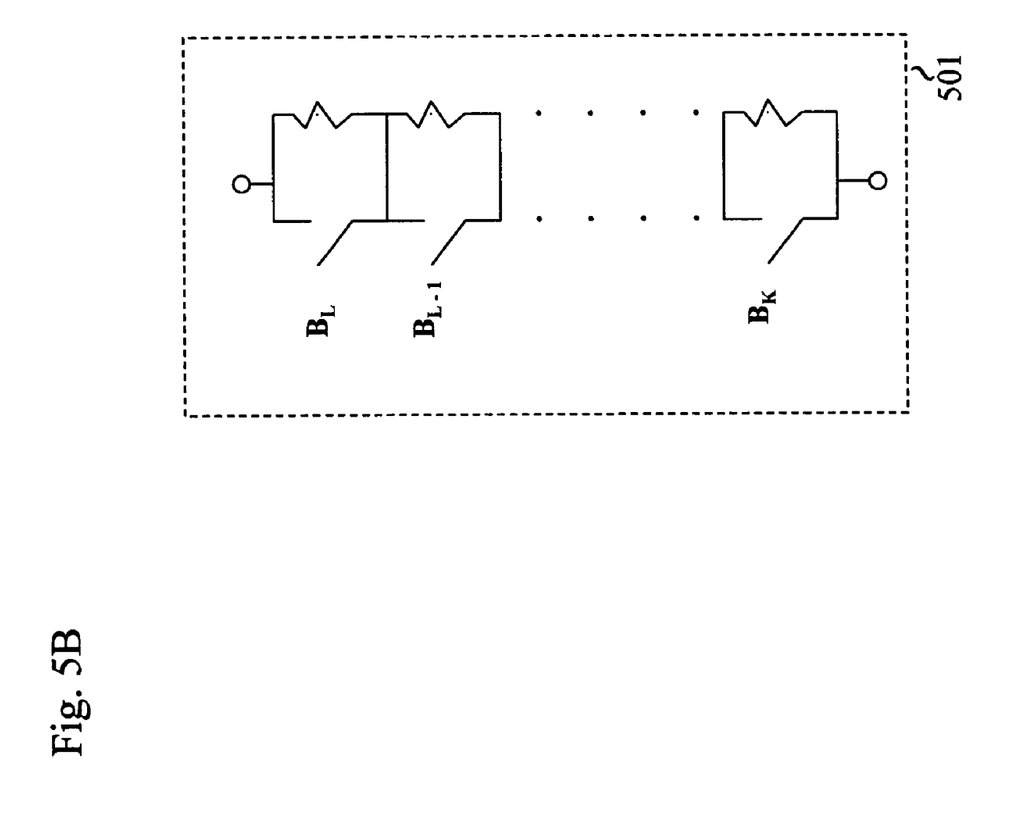
FIG. 5B is an electrical schematic diagram of a representative variable resistance circuit suitable for use in the chop signal generation circuit of FIG. 5B.

In the embodiment FIG. 5A, the current $I_{OSC}$ is also varied with a variable resistance circuitry 501, which may be, for example, the switched resistor network shown in FIG. 5B. In this embodiment, bits $B_K$-$B_L$ of the randomly generated bits $B_0$-$B_N$ generated by random number generator 401 of FIG. 4C are utilized to randomly vary the resistance of variable resistance circuitry 501. The remaining bits generated by random number generator 402 vary the current $I_{RANDOM}$, as described above.

FIG. 5A also includes variable current generators 502a and 502b, which respectively vary the current $I_C$ through capacitors 408a and 408b. In the illustrated embodiment, bits $B_R$-$B_S$, taken from the total set of bits $B_0$-$B_N$ generated by random number generator 402, randomly vary the current output by variable current generators 502a and 502b. Variable current generators 502a and 502b are similar to the variable current generator 402 shown in FIG. 4D. The remaining bits, of the total set of bits $B_0$-$B_N$, vary the current $I_{RANDOM}$ and/or the resistance through variable resistance circuitry 501, as described above.

In sum, the principles of the present invention provide chopper stabilization techniques for opamps that advantageously avoid generating high-energy output artifacts at fixed frequencies. In particular, by randomizing the chopping frequency, the energy of the chopping artifacts is spread across a wider bandwidth. By limiting this bandwidth, this chopping artifact energy is more easily filtered out.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. An operational amplifier comprising:
   at least one amplifier stage;
   chopping circuitry for chopping both an input signal to the amplifier stage and an output signal from the amplifier stage with a chopping signal having a frequency randomly varying within a selected chopping frequency band;
   an oscillator having an output randomly modulated by a control signal presented at an oscillator control input to generate the chopping signal having a frequency randomly varying within the selected chopping frequency band; and
   circuitry for generating the control signal for randomly modulating the oscillator output.

2. The operational amplifier of claim 1, wherein the oscillator comprises a current controlled oscillator and the circuitry for generating the control signal generates randomly varying amounts of current for presentation to the oscillator control input.

3. The operational amplifier of claim 2, wherein the circuitry for generating the control signal comprises;
   a variable current source for generating varying amounts of current in response to digital bits received at a corresponding current control input; and
   circuitry for providing digital bits with pseudo-random values to the current control input of the variable current source.

4. An operational amplifier comprising:
   at least one amplifier stage;
   chopping circuitry for chopping both an input signal to the amplifier stage and an output signal from the amplifier stage with a chopping signal having a frequency randomly varying within a selected frequency band; and circuitry for generating the chopping signal having a frequency randomly varying within the selected frequency band, comprising:
  a random number generator for pseudo-randomly generating numbers represented by a corresponding number of control bits; and
  oscillator circuitry for generating the chopping signal having a frequency randomly varying within the selected frequency band in response to the control bits.

5. The operational amplifier of claim 4, wherein the oscillator circuitry comprises:
  a current controlled oscillator outputting the chopping frequency within the selected frequency band in response to a corresponding amount of current; and
  a current source generating amounts of current corresponding to the control bits for controlling the current controlled oscillator.

6. The operational amplifier of claim 5, wherein the current source comprises:
  a source of a fixed current; and
  circuitry for selectively adding a quantum of current to the fixed current proportional to the control bits.

7. The operational amplifier of claim 5, wherein the current controlled oscillator comprises a relaxation oscillator.

8. The operational amplifier of claim 5, wherein the circuitry for selectively adding a quantum of current adds current in quanta of $I/X^N$, wherein N is the pseudo-randomly generated number represented by the control bits, X is a selected factor, and I is a selected base current.

9. A method of minimizing output artifacts in a chopper-stabilized operational amplifier comprising:
  chopping both an input signal to an amplifier stage and an output signal from the amplifier stage with a chopping signal having a frequency randomly varying within a selected chopping frequency band; and
  randomly modulating an output of an oscillator with a control signal presented at an oscillator control input to generate the chopping signal having a frequency randomly varying within the selected chopping frequency band.

10. The method of claim 9, wherein the oscillator comprises a current controlled oscillator, and the method further comprises generating the control signal by randomly varying amounts of current.

11. The method of claim 10, wherein generating the control signal by randomly varying amounts of current comprises generating randomly varying amounts of current with a variable current source responsive to digital bits representing pseudo-randomly varying values.

12. A method of minimizing output artifacts in a chopper-stabilized operational amplifier comprising:
  chopping both an input signal to an amplifier stage and an output signal from the amplifier stage with a chopping signal having a frequency randomly varying within a selected chopping frequency band; and
  generating the chopping signal comprising:
    generating pseudo-random numbers represented by corresponding control bits;
    generating the chopping signal having a frequency randomly varying within the selected chopping frequency band with an oscillator controlled by the control bits.

13. The method of claim 12, wherein generating the chopping signal comprises:
  varying a current to the oscillator in response to the control bits to vary a frequency of oscillation of the oscillator to generate the chopping signal with a randomly varying frequency.

14. The method of claim 13, wherein varying the current to the oscillator comprises:
  generating a fixed current setting a nominal oscillation frequency of the oscillator; and
  adding a quantum of current proportional to the control bits to the fixed current to vary the current to the oscillator to varying the frequency of the oscillator from the nominal oscillation frequency.

15. The method of claim 14, wherein adding a quantum of current comprises generating a quantum of current of $I/2^2$, wherein N is the pseudo-randomly generated number represented by the control bits and I is a selected base current.

16. A multiple-stage operational amplifier comprising:
  a gain stage including an amplifier and chopping switches at an input and an output of the amplifier, the chopping switches modulating an input signal to the gain stage and demodulating an output signal from the gain stage in response to a chopping signal;
  an output driver coupled to the gain stage for driving an output load;
  chopping signal generation circuitry for generating the chopping signal to have a randomly varying frequency within a selected chopping frequency band including an oscillator having a chopping signal output randomly modulated by a control signal presented at an oscillator control input and circuitry for generating the control signal for randomly modulating the oscillator output.

17. The operational amplifier of claim 16, further comprising a second gain stage coupling the gain stage and the output driver.

18. The operational amplifier of claim 16, wherein the gain stage implements dominant pole frequency compensation and the output driver provides a low gain across a wide bandwidth.

* * * * *

UNITED STATES PATENT AND TRADEMARK OFFICE
CERTIFICATE OF CORRECTION

PATENT NO. : 7,262,654 B2 Page 1 of 1
APPLICATION NO. : 11/036082
DATED : August 28, 2007
INVENTOR(S) : Murari Kejariwal, Gowtham Vemulapalli and John Laurence Melanson It is certified that error appears in the above-identified patent and that said Letters Patent is hereby corrected as shown below:

Title Page, item 75, inventor should read --Laurence--.

Signed and Sealed this

Fourth Day of March, 2008

JON W. DUDAS
*Director of the United States Patent and Trademark Office*